United States Patent [19]
Miller et al.

[11] Patent Number: 5,958,655
[45] Date of Patent: Sep. 28, 1999

[54] ALKALINE DEVELOPING COMPOSITION AND METHOD OF USE TO PROCESS LITHOGRAPHIC PRINTING PLATES

[75] Inventors: Gary R. Miller, Ft. Collins; Melanie A. Felker, Loveland, both of Colo.

[73] Assignee: Kodak Polychrome Graphics LLC, Norwalk, Conn.

[21] Appl. No.: 09/111,666

[22] Filed: Jul. 8, 1998

Related U.S. Application Data

[62] Division of application No. 08/865,795, May 30, 1997, Pat. No. 5,811,221.

[51] Int. Cl.⁶ .................................................. G03C 5/305
[52] U.S. Cl. ............................................ 430/331; 430/493
[58] Field of Search ..................................... 430/331, 493

[56] References Cited

U.S. PATENT DOCUMENTS

| | | | |
|---|---|---|---|
| 3,615,480 | 10/1971 | Lam | 430/321 |
| 3,650,745 | 3/1972 | Hackmann et al. | 430/322 |
| 4,259,434 | 3/1981 | Yamasue et al. | 430/302 |
| 4,452,880 | 6/1984 | Seino et al. | 430/309 |
| 4,469,776 | 9/1984 | Matsumoto et al. | 430/309 |
| 4,576,903 | 3/1986 | Baron et al. | 430/331 |
| 4,592,992 | 6/1986 | Hsieh et al. | 430/309 |
| 4,628,023 | 12/1986 | Cawston et al. | 430/331 |
| 4,822,723 | 4/1989 | Phillon | 430/331 |
| 4,945,030 | 7/1990 | Turner et al. | 430/331 |
| 5,035,982 | 7/1991 | Walls | 430/331 |
| 5,164,286 | 11/1992 | Blackeney et al. | 430/331 |
| 5,168,032 | 12/1992 | Okamoto et al. | 430/281 |
| 5,234,796 | 8/1993 | Shimura et al. | 430/331 |
| 5,250,393 | 10/1993 | Imai et al. | 430/302 |
| 5,279,927 | 1/1994 | Walls et al. | 430/331 |
| 5,292,626 | 3/1994 | Buhr et al. | 430/331 |
| 5,316,892 | 5/1994 | Walls et al. | 430/309 |
| 5,380,623 | 1/1995 | Miller et al. | 430/309 |
| 5,466,559 | 11/1995 | Miller et al. | 430/331 |
| 5,480,762 | 1/1996 | Toyama et al. | 430/309 |
| 5,695,903 | 12/1997 | Elsaesser et al. | 430/117 |
| 5,766,826 | 6/1998 | Miller et al. | 430/331 |

FOREIGN PATENT DOCUMENTS

| | | |
|---|---|---|
| 0129106 | 12/1984 | European Pat. Off. |
| 0178495 | 4/1986 | European Pat. Off. |
| 0274044 | 7/1988 | European Pat. Off. |
| 0323836 | 7/1989 | European Pat. Off. |
| 0347245 | 12/1989 | European Pat. Off. |
| 0466071 | 1/1992 | European Pat. Off. |
| 0490515 | 6/1992 | European Pat. Off. |
| 19520741 | 6/1994 | Germany. |
| 61-215554 | 3/1985 | Japan. |
| 1056442 | 3/1989 | Japan. |
| 287561 | 11/1989 | Japan. |
| 3228054 | 10/1991 | Japan. |
| 2060923 | 9/1979 | United Kingdom. |
| 2276729 | 10/1994 | United Kingdom. |

*Primary Examiner*—Hoa Van Le
*Attorney, Agent, or Firm*—Ratner & Prestia

[57] ABSTRACT

An alkaline developing composition for processing a lithographic printing plate includes an alkali metal silicate, at least 6 weight % of a thickener such as glycerine, and a nonionic fluorosurfactant or a phosphate ester hydrotrope. Lithographic printing plates that can be developed using this composition are either positive- or negative-working, and include both positive- and negative-working thermal plates.

16 Claims, No Drawings

ALKALINE DEVELOPING COMPOSITION AND METHOD OF USE TO PROCESS LITHOGRAPHIC PRINTING PLATES

CROSS-REFERENCE TO RELATED APPLICATIONS

This application is a divisional of application Ser. No. 08/865,795, filed May 30, 1997, now U.S. Pat. No. 5,811,221 allowed May 14, 1998.

FIELD OF THE INVENTION

This invention relates in general to lithography and in particular to aqueous alkaline developing compositions useful for developing either positive-working or negative-working lithographic printing plates. It also relates to a method of using this developing composition to process imagewise exposed printing plates.

BACKGROUND OF THE INVENTION

The art of lithographic printing is based upon the immiscibility of oil and water, wherein the oily material or ink is preferentially retained by the image areas and the water or fountain solution is preferentially retained by the non-image areas of the printing plate. When a suitably prepared surface is moistened with water and an ink is then applied, the background or non-image areas retain the water and repel the ink while the image areas accept the ink and repel the water. The ink on the image areas is then transferred to the surface of a material upon which the image is to be reproduced, such as paper, cloth and plastics. Commonly, the ink is transferred to an intermediate material called the blanket which in turn transfers the ink to the surface of the material upon which the image is to be reproduced.

Lithographic printing plates can be either negative-working or positive-working, and comprise one or more photosensitive layers on a suitable substrate, such as a metal or polymeric support. The photosensitive layer generally includes one or more photosensitive components that may be dispersed in a suitable binder. Alternatively, the photosensitive component can also be the binder material. Certain useful printing plates can be used either as positive-working or negative-working.

A negative-working printing plate generally has a light sensitive layer composed of a photosensitive component such as an unsaturated resin on a suitable substrate. Upon exposure to light, the exposed areas are hardened, leaving non-exposed areas removable during development. The exposed, hardened areas are therefore oleophilic and will accept ink while the non-exposed underlying areas of the substrate are hydrophilic.

A positive-working printing plate generally has a light sensitive layer composed of a photosensitive component such as an o-diazoquinone or diazonaphthoquinone compound. Upon exposure to light the photosensitive component is converted to the corresponding carboxylic acid. The use of an alkaline developer will remove only the exposed areas of the photosensitive layer, leaving the surface of the support. Since the surface of the support is hydrophilic, the uncovered non-image area attracts water and repels the oily ink. The image area remaining after development is oleophilic thereby repelling water and attracting the printing ink.

Various aqueous solutions are known for use as developers for both positive-working and negative-working printing plates. It is known to use a dispersion of a silicate to develop positive-working printing plates, as described, for example, in U.S. Pat. No. 4,259,434 (Yamasue et al). These solutions include alkali metal silicates, in which the ratio of $SiO_2$ to M is from 0.5 to 0.75 ("M" being the alkali metal) and the SiO2 concentration is about 1–4%. However, many of such developers are overly active and attack or remove the unexposed image on the plates. The replenishment rate of such developers is critical because the operational range of the developers is very narrow.

U.S. Pat. No. 4,452,880 (Seino et al) describes silicate-containing developers wherein the $SiO_2$ to alkali metal oxide ratios are much higher, that is between 1.6 and 2.0, and the % $SiO_2$ concentration is from about 2 to about 9%. These developers have relatively low activity, resulting in slow or incomplete development within the time necessary for practical commercial use. Thus, higher amounts of silicate must be included. Such higher amounts can be disadvantageous due to cost, residue on the plates and the potential for clogging processing equipment.

Copending and commonly assigned U.S. Ser. No. 08/729,471, filed by Miller and Felker on Oct. 11, 1996, and U.S. Ser. No. 08/729,472, filed by Miller, Stuber and Felker on Oct. 11, 1996, describe alkaline developer compositions that overcome the problems noted above and provide a significant advance in the art. Both applications describe compositions containing specific amounts of silicates, and preferred compositions also include at least 6% (by weight) of a water-soluble or water-dispersible thickener, such as glycerine. However, there is a need to further improve such compositions so they provide optimal performance with infrared radiation sensitive ("thermal") lithographic printing plates. Particularly, it is desired to provide greater processing latitude, and to better protect imaged areas of the plates during alkaline processing.

SUMMARY OF THE INVENTION

The problems noted above have been solved with the use of an alkaline developing composition that is useful in developing lithographic printing plates, the composition having a pH of at least 12 and comprising:

a) an alkali metal silicate, b) at least 6 weight % of a water-soluble or water-dispersible thickener, and c) at least 0.0005 weight % of a nonionic fluorosurfactant, a phosphate ester hydrotrope, or a mixture thereof.

This developing composition is useful in a method of processing comprising developing an imagewise exposed positive-working or negative-working lithographic printing plate as described in more detail below. In addition, the composition can also be used to develop both positive-working plates and negative-working thermal plates (that is, those exposed to heat for hardening exposed regions, or those that are sensitive to infrared radiation). These advantages allow the user to install only one machine for processing both types of plates.

This developing composition has just the desired activity for extended usefulness. It is not too active or too slow in development, and is less corrosive. Thus, the action of the developing composition at the beginning of its use is not overly aggressive, and it retains suitable activity until it is discarded. Importantly, it has a prolonged usefulness as a processing solution. Thus, the user can obtain more consistent photographic speed and image quality throughout the time the developing composition is used.

The developing composition provides greater processing latitude than conventional developing compositions. Moreover, it can be used as its own replenisher, thus eliminating the need for specially formulated replenishing solutions of higher activity to maintain the useful life of the processing bath. When used as a replenishing solution, the replenishment rate of the composition of this invention is generally lower than that used with compositions lacking a thickener.

These advantages are provided by including within the developing composition at least 6 weight % of a water-soluble or water-dispersible thickener. Useful thickeners are described in more detail below. In preferred embodiments, the amount of alkali metal silicate in the composition is also kept within certain amounts as described in more detail below. Thus, the ratio of $SiO_2/M_2O$ (wherein "M" is alkali metal) may also be important to optimize the advantages described above.

In addition, the developing composition provides optimal performance with infrared radiation sensitive positive-working printing plates. This advantage is achieved by including the noted nonionic fluorosurfactant or phosphate ester hydrotrope within the composition. It is uncertain as to the mechanism for this improvement, but as the examples show below, the nonionic fluorosurfactant or phosphate ester hydrotrope protects the image portions of the plate without excessively retarding development activity in non-image areas.

DETAILED DESCRIPTION OF THE INVENTION

As noted above, the aqueous alkaline developing compositions of this invention include water and at least one alkali metal silicate, such as a lithium, sodium and potassium silicate. Sodium and potassium silicates are preferred and potassium silicate is most preferred. A mixture of alkali metal silicates can be used if desired.

Especially preferred developing compositions contain an alkali metal silicate having a $SiO_2$ to $M_2O$ weight ratio of at least 0.3 wherein "M" is the alkali metal (such as potassium). Preferably, this ratio is from about 0.3 to about 1.2. More preferably, it is from about 0.6 to about 1.1, and most preferably, it is from about 0.7 to about 1.0.

The amount of alkali metal silicate in the developing composition is generally at least 20 grams $SiO_2$ per 1000 grams of composition (that is, at least 2 weight %), and preferably from about 20 to about 80 grams $SiO_2/1000$ grams of composition. Most preferably, it is from about 40 to about 65 g $SiO_2/1000$ g of developing composition. Various commercial sources of silicates are known.

The developing composition has an alkaline pH that is generally at least 12, and preferably from about 12 to about 14. In addition to the alkali silicate, alkalinity can be provided using a suitable concentration of any suitable chemical base, such as a hydroxide (for example, ammonium hydroxide, sodium hydroxide, lithium hydroxide and potassium hydroxide).

Useful thickeners for the developing compositions of this invention are water-soluble or water-dispersible polyhydroxy compounds. Representative compounds include, but are not limited to, glycerine (or glycerol), polyethylene glycol, polypropylene glycol and other similar materials having a plurality of hydroxy groups, that would be readily apparent to one skilled in the art in view of the teaching herein. The particular thickener that will provide the desired performance may depend upon its concentration, the amount of chemical base or silicates used, and the type of plate being processed. Thus, some routine experimentation may be needed to find the optimum levels of a given thickener for a given type of printing plate. Some thickeners may provide advantageous results only with positive-working plates, while others do the same for negative-working plates only. More preferably, the thickeners are useful universally, that is, with positive-working plates or negative-working thermal plates over the entire disclosed concentration range. Thickeners that provide these unexpected universal processing properties include non-polymeric thickeners such as glycerine. A mixture of thickeners can be used if desired.

The amount of thickener used in the developing composition is at least 6 weight %, and an amount of from 6 to about 30 weight % is preferred. More preferably, the thickener is present in an amount of from about 7.5 to about 18 weight %. The amount of thickener used in a given developing composition may vary depending upon the type of printing plate being processed and the type of photosensitive materials in the printing plate. For example, the optimal amount of thickener useful for processing positive-working plates may be different than the optimal amount of thickener useful for processing negative-working thermal plates. A skilled worker in the art would be able to determine the useful amounts for a given type of printing plate and photosensitive material using routine experimentation. A most preferred composition of this invention includes glycerine at a concentration of from about 8 to about 12 weight %.

Useful nonionic fluorosurfactants are surfactant active agents that are typically water-soluble and have one or more fluorocarbon moieties in the molecule wherein at least one hydrogen atom has been replaced with a fluorine atom. Each fluorocarbon moiety generally has at least 4 carbon atoms and can be saturated or unsaturated.

A representative class of nonionic fluorosurfactants has the formula:

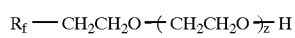

wherein $R_f$ is

and z is 4 to 20.

Representative useful fluorosurfactants of this type include, but are not limited to, fluoroalkylpolyethyleneoxide alcohols, such as those commercially available as Zonyl® FSN, Zonyl® FS 300 or Zonyl® FSO nonionic surfactants from DuPont, and Flurad® FC-430 or Fluowet® OT from Hoechst. Zonyl® FSN nonionic surfactant is most preferred.

Phosphate ester hydrotropes are anionic phosphate ester surfactants containing at least one phosphate ester moiety. As "hydrotropes", such compounds help solubilize other surfactants, and may themselves have surfactant properties. A preferred phosphate ester hydrotrope is an alkyl aryl alkoxy phosphate, potassium salt that is commercially available as Triton® H-66 from Union Carbide. Other useful commercial products include Triton® H-55, an aryl alkoxy phosphate ester, potassium salt. Thus, a useful class of hydrotropes are aryl alkoxy phosphate esters, wherein the aryl and alkoxy portions of the molecule can be repeated numerous times and can be substituted or unsubstituted.

The amount of nonionic fluorosurfactant or phosphate ester hydrotrope useful in the composition of this invention is at least 0.005 grams per 1000 grams of solution, and up to about 4 grams per 1000 grams of solution (that is, from about 0.0005 to about 0.4 weight %). Preferably, either or both types of compounds are present in an amount of from about 0.5 to about 3.0 grams per 1000 grams of solution (that is, from about 0.05 to about 0.3 weight %).

Mixtures of nonionic fluorosurfactants, phosphate ester hydrotropes, or both types of compounds, can be used if desired as long as the total amounts are between about 0.005 and about 0.4 weight %.

Optional components of the developing composition include one or more nonfluorinated surfactants (anionic, nonionic and amphoteric) other than those noted above, in a suitable amount (for example, up to 3% based on total composition weight), a biocide (antimicrobial or antifungal agent), one or more anti-foaming agents, or chelating agents, such as alkali gluconates. However, in preferred embodiments, non-fluorinated surfactants, anti-foaming agents and chelating agents are omitted from the composition.

In one embodiment, a positive-working printing plate is imagewise exposed using a suitable light source, turning the exposed regions alkali soluble. Accordingly, the exposed regions are washed away with the alkaline developing composition of this invention to reveal the hydrophilic substrate underneath.

Development of a positive-working printing plate according to this invention is generally conducted at a temperature of from about 18 to about 28° C. for a period of from about 5 to about 60 seconds.

The positive-working printing plates processed in the practice of this invention can be any of those conventionally used in the art They can include a metal or polymeric substrate, which is preferably an aluminum, aluminum alloy or treated aluminum substrate. Such substrates are well known in the art, for example, as described in U.S. Pat. No. 4,259,434 (noted above), U.S. Pat. No. 5,122,243 (Hall) and U.S. Pat. No. 5,368,974 (Walls et al).

On the substrate is a suitable positive-working photosensitive layer that includes a photosensitive component such as an o-diazoquinone, including an o-diazonaphthoquinone compound as described in U.S. Pat. No. 4,927,741 (Garth et al) and GB-2,082,339 (published Mar. 3, 1982).

Although these photosensitive compounds can be used alone, more typically they are dispersed in a suitable binder material (or mixture thereof) that is soluble in the alkaline developing composition. Such binder materials include, but are not limited to, novolac-type phenolic resins, and others readily apparent to one skilled in the art. Further additives can be included in the photosensitive layer composition, including dyes, plasticizers, and components that give printout properties.

In a preferred embodiment, the composition of this invention is useful for processing the positive-working infrared radiation sensitive printing plates described in U.S. Ser. No. 08/821,844 filed Mar. 21, 1997 by West et al. Such printing plates have a layer sensitive to infrared radiation, the layer including at least 50 weight % of a phenolic binder resin (such as a novolac resin), and an infrared radiation absorbing compound [such as a dye or pigment that has a maximum absorption wavelength ($\lambda_{max}$) of at least 700 nm, and preferably at from about 800 to about 1100 nm]. The radiation sensitive layer also includes one or more non-photosensitive "dissolution inhibitor compounds". Such compounds have a polar functionality that serves as acceptor sites for hydrogen bonding with hydroxy groups on aromatic rings (such as in the phenolic binder resin). Useful polar groups include keto groups (including vinylogous esters). Other details of such compounds and positive-working elements are provided in the noted copending application of West et al, incorporated herein by reference.

Such printing plates are uniquely adapted for "direct-to-plate" imaging applications. Such systems utilize digitized image information, as stored on a computer disk, compact disk, computer tape or other digital information storage media, or information that can be provided directly from a scanner, that is intended to be printed. The bits of information in a digitized record correspond to the image elements or pixels of the image to be printed. This pixel record is used to control the exposure device, that is a modulated laser beam. The position of the laser beam can be controlled using any suitable means known in the art, and turned on and off in correspondence with pixels to be printed. The exposing beam is focused onto the unexposed printing plate. Thus, no exposed and processed films are needed for imaging of the plate, as in the conventional lithographic imaging processes.

Laser imaging can be carried out using any moderate or high-intensity laser writing device. Specifically, a laser printing apparatus is provided that includes a mechanism for scanning the write beam across the element to generate an image without ablation. The intensity of the write beam generated at the laser diode source at the printing plate is at least 0.2 mW/$\mu$m$^2$. During operation, the plate to be exposed is placed in the retaining mechanism of the writing device and the write beam is scanned across the plate to generate an image.

Following laser imaging, the printing plate of this invention is then developed in the alkaline developing composition of this invention until the image areas are removed to provide the desired positive image. The time for development is generally from about 5 to about 60 seconds.

In another embodiment of this invention, a negative-working printing plate can be imagewise exposed using a suitable light source, hardening the exposed regions. Accordingly, the non-exposed regions are washed away with the alkaline developing composition of this invention to reveal the hydrophilic substrate underneath. Especially useful are negative-working thermal plates that also contain an infrared radiation absorbing compound, rendering the photosensitive layer infrared radiation (or heat) sensitive. Thus, a laser or other source of infrared radiation can be used to reduce solubility in exposed regions of the plate. A variety of materials are known for such plates, as described for example, in U.S. Pat. No. 5,340,699 (Haley et al), U.S. Pat. No. 5,466,557 (Haley et al) and U.S. Pat. No. 5,491,046 (DeBoer et al).

Development of a negative-working printing plate according to this invention is generally conducted at a temperature of from about 18 to about 28° C. for a period of from about 5 to about 60 seconds.

The negative-working printing plates processed in the practice of this invention typically include a metal or polymeric substrate, as described above for the positive-working plates.

On the substrate is an appropriate negative-working photosensitive layer that includes a photosensitive component, such as photosensitive polymer, and optionally a suitable binder, such as a novolac or resole resin, or both. Such materials are well known in the art, as evidenced by the teaching in U.S. Pat. No. 5,372,907 (Haley et al). Further additives can be included in the photosensitive layer composition, including dyes, plasticizers, Bronsted acid precursors, infrared radiation absorbing compounds, sensitizers, stabilizers, surfactants, and components that give printout properties, as are also well known in the art.

One preferred developing composition of this invention is useful in developing either positive-working or negative-working thermal lithographic printing plates, the composition having a pH of from about 12 to about 14 and comprising:

a) potassium silicate in an amount to provide from about 40 to about 65 g of $SiO_2$ per 1000 g of composition, and a weight ratio of $SiO_2$ to $K_2O$ of from about 0.7 to about 1.0, b) from about 6 to about 18 weight % of a non-polymeric thickener, such as glycerine, and c) from about 0.0005 to about 0.4 weight % g of a nonionic fluorosurfactant, a phosphate ester hydrotrope, or mixture thereof.

The following examples are intended to illustrate the practice of this invention, and not to limit it in any way. All percentages are by weight, unless otherwise indicated.

Materials and Methods for Examples

The developing compositions were formulated with a $SiO_2/K_2O$ ratio of 2.1 (KASIL 2130), which ratio could be adjusted by the addition of potassium hydroxide. The amount of $SiO_2$ was adjusted by the addition of water. Developer compositions having various $SiO_2/K_2O$ ratios and $SiO_2$ concentrations were prepared with 9% glycerine and a nonionic fluorosurfactant, Zonyl® FSN, at concentrations of 0 to 0.4 weight %.

Each developing composition was sealed in water tight containers and submerged in a temperature controlled (19° C.) water bath to simulate a constant processing temperature. After the composition temperature had equilibrated, a cotton swab was dipped into it, and then lightly wiped across the surface of the imagewise exposed lithographic printing plates (described below). The plates were hand processed to assure constant temperature.

The printing plates were exposed to radiation using a laser emitting at 1064 nm (infrared) on a commercial Gerber Crescent 42/T Platesetter before processing. The mirror rotation speed was 200 rps and the power setting was 225 (relative) to provide an exposure equivalent to 217 $mJ/cm^2$.

The printing plates were then processed for 30 seconds in the alkaline developing composition. After development, the printing plates were rinsed and dried under conventional conditions.

Performance of each developing composition was then evaluated by considering the $D_{max}$, $D_{min}$ and cleanout time for each developed plate at four levels:

"optimal performance" (all criteria were within the optimal ranges noted above) was rated a "1", "good performance" (all criteria were close to optimal ranges) was rated a "2", "functional performance" (the plates processed did not provide optimal performance but did produce an image with clean non-image areas) was rated a "3", and "poor performance" (the plates did not provide acceptable performance, severe image attack by the developing composition, or lack of processing activity) was rated a "4".

Level One ("1"): $D_{max}>150$, $D_{min}<35$, and cleanout time <16 seconds,

Level Two ("2"): $D_{max}>145$, $D_{min}<35$, and cleanout time <21 seconds,

Level Three ("3"): $D_{max}>140$, $D_{min}<35$, and cleanout time <31 seconds,

Level Four ("4"): $D_{max}<140$, $D_{min}>35$, or cleanout time >31 seconds.

EXAMPLE 1

Developing Composition & Processing

An infrared radiation sensitive, positive-working printing plate was prepared with the following radiation-sensitive composition:

| | |
|---|---|
| α-Naphthoflavone | 0.46 g |
| 4,6-Dimethyl-N,N'-diphenyl-1,3-benzenesulfonamide | 0.11 g |
| Cresol-formaldehyde novalac resin (39.8%) in acetone | 13.06 g |
| Carbon black dispersion (7.66%) | 4.52 g |
| CG-21-1005 Dye* | 0.11 g |
| BYK 307** (10%) in 1-methoxy-2-propanol | 0.11 g |
| 1-Methoxy-2-propanol | 81.63 g |

*Oxonol dye available from Ciba-Geigy.
**Polyether-modified polydimethylsiloxane surfactant available from BYK-Chemie.

The composition was coated on an anodized aluminum substrate, dried, and exposed as noted above. Each plate was then processed using the following developing compositions.

| | |
|---|---|
| Composition A | "4" |
| Composition B | "4" |
| Composition C | "4" |
| Composition D | "1" |

The results of the processing evaluations are as follows:

| | |
|---|---|
| Composition A | "4" |
| Composition B | "4" |
| Composition C | "4" |
| Composition D | "1" |

Thus, only Composition D, containing both glycerine thickener and the nonionic fluorosurfactant provided the desired optimal results in plate development and performance. Developing composition D is the preferred composition of this invention.

EXAMPLE 2

Alternative Developing Composition

Another developing composition of this invention was similarly prepared but having a phosphate ester hydrotrope, Triton® H-66 (50 weight %), in place of the Zonyl® FSN nonionic surfactant.

| | |
|---|---|
| Water | 549.0 g |
| KASIL 2130 (30%) | 276.4 |
| KOH (90%) | 58.5 |
| Glycerine | 112.1 |
| Triton ® H-66 | 4.0 |
| $SiO_2/K_2O$ ratio | 0.79 |
| $SiO_2$ g/1000 g | 56.2 |

This developing composition was used to process imagewise exposed printing plates as described in Example 1 above. The result of the processing evaluation was a rating of "2", that is a good performance.

EXAMPLE 3

Developing Composition with Mixture of Compounds

A developing composition of this invention was similarly prepared but having including both Zonyl® FSN nonionic surfactant (40 weight %) and a phosphate ester hydrotrope Triton® H-66 (50 weight %).

| | |
|---|---|
| Water | 549.0 g |
| KASIL 2130 (30%) | 276.4 |
| KOH (90%) | 58.5 |
| Glycerine | 112.1 |
| Zonyl ® FSN (40%) | 3.0 |
| Triton ® H-66 | 1.0 |
| SiO$_2$/K$_2$O ratio | 0.79 |
| SiO$_2$ g/1000 g | 56.2 |

When this developing composition was used to process an imagewise exposed printing plate as described in Example 1, the results justified a "1" rating, that is, optimal performance.

The invention has been described in detail with particular reference to preferred embodiments thereof, but it will be understood that variations and modifications can be effected within the spirit and scope of the invention.

We claim:

1. An aqueous alkaline developing composition that is useful in developing lithographic printing plates, said composition having a pH of at least 12 and comprising:
    a) an alkali metal silicate,
    b) at least 6 weight % of glycerine, and
    c) at least 0.0005 weight % of a nonionic fluorosurfactant, a phosphate ester hydrotrope, or a mixture thereof.

2. The composition of claim 1 wherein said composition has a pH of from about 12 to about 14 and contains a hydroxide as a chemical base.

3. The composition of claim 1 wherein said alkali metal silicate is present in an amount to provide at least 20 g SiO$_2$ per 1000 g of composition, and a weight ratio of SiO$_2$ to M$_2$O of at least 0.3 wherein M is an alkali metal.

4. The composition of claim 3 wherein said alkali metal silicate is present in an amount to provide from about 20 to about 80 g SiO$_2$ per 1000 g of composition, and a weight ratio of SiO$_2$ to M$_2$O of from about 0.3 to about 1.2.

5. The composition of claim 4 wherein said alkali metal silicate is present in an amount to provide from about 40 to about 65 g SiO$_2$ per 1000 g of composition, and a weight ratio of SiO$_2$ to M$_2$O of from about 0.6 to about 1.1.

6. The composition of claim 1 wherein said glycerine is present in an amount of from 6 to about 30 weight %.

7. The composition of claim 6 wherein said glycerine is present in an amount of from about 7.5 to about 18 weight %.

8. The composition of claim 1 wherein said nonionic fluorosurfactant has the formula

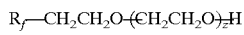

wherein z is 4 to 20 and R$_f$ is

and wherein said nonionic surfactant is present in an amount of up to 0.4 weight %.

9. The composition of claim 1 wherein said phosphate ester hydrotrope is an alkyl aryl alkoxy or an aryl alkoxy phosphate ester, alkali metal salt and is present in an amount of up to 0.4 weight %.

10. The composition of claim 1 wherein said alkali metal silicate is potassium silicate.

11. An aqueous alkaline developing composition that is useful in developing either a positive-working or negative-working thermal lithographic printing plate, said composition having a pH of from about 12 to about 14 and comprising:
    a) potassium silicate in an amount to provide from about 40 to about 65 g SiO$_2$ per 1000 g of composition, and a weight ratio of SiO$_2$ to K$_2$O of from about 0.7 to about 1.0,
    b) from about 6 to about 18 weight % of glycerine, and
    c) from about 0.0005 to about 0.4 weight % of a nonionic fluorosurfactants having the formula

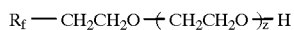

wherein z is 4 to 20 and R$_f$ is

12. The composition of claim 11 wherein said glycerine is present in an amount of from about 7.5 to about 18 weight %.

13. The composition of claim 12 wherein said nonionic fluorosurfactant is present in an amount of from about 0.05 to 0.3 weight %.

14. An aqueous alkaline developing composition that is useful in developing either positive-working or negative-working thermal lithographic printing plates, said composition having a pH of at from about 12 to about 14 and comprising:
    a) potassium silicate in an amount to provide from about 40 to about 65 g SiO$_2$ to K$_2$O of from about 0.7 to about 1.0;
    b) from about 6 to about 18 weight % of glycerine; and
    c) from about 0.0005 to about 0.4 weight % of a nonionic fluorosurfactant.

15. The composition of claim 14 wherein said glycerine is present in an amount of from about 7.5 to about 18 weight %.

16. The composition of claim 15 wherein said nonionic fluorosurfactant is present in an amount of from about 0.05 to 0.3 weight %.

* * * * *